(12) United States Patent
Liu et al.

(10) Patent No.: US 7,421,414 B2
(45) Date of Patent: Sep. 2, 2008

(54) SPLIT MACHINE LEARNING SYSTEMS

(75) Inventors: Wei Liu, Santa Clara, CA (US); Junwei Bao, Fremont, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 362 days.

(21) Appl. No.: 11/096,782

(22) Filed: Mar. 31, 2005

(65) Prior Publication Data

US 2006/0224528 A1   Oct. 5, 2006

(51) Int. Cl.
*G06F 15/18* (2006.01)
*G06E 1/00* (2006.01)
*G06E 3/00* (2006.01)
*G06G 7/00* (2006.01)
*G06N 3/08* (2006.01)

(52) U.S. Cl. ............... 706/12; 706/16; 706/25; 359/11; 359/107; 382/209

(58) Field of Classification Search ............ 706/12, 706/16, 25; 382/209; 359/11, 107
See application file for complete search history.

(56) References Cited

U.S. PATENT DOCUMENTS

| | | | |
|---|---|---|---|
| 5,479,573 A | 12/1995 | Keeler et al. |
| 5,793,480 A | 8/1998 | Lacey et al. |
| 5,889,593 A | 3/1999 | Bareket |
| 6,023,327 A | 2/2000 | Shabde et al. |
| 6,192,103 B1 | 2/2001 | Wormington et al. |
| 6,609,086 B1 | 8/2003 | Bao et al. |
| 6,633,831 B2 | 10/2003 | Nikoonahad et al. |
| 6,650,422 B2 | 11/2003 | Singh et al. |
| 6,657,736 B1 | 12/2003 | Finarov et al. |
| 6,665,446 B1 | 12/2003 | Kato et al. |
| 6,704,661 B1 | 3/2004 | Opsal et al. |
| 6,771,356 B1 * | 8/2004 | Lyons et al. ............ 356/32 |
| 6,782,337 B2 | 8/2004 | Wack et al. |
| 6,785,638 B2 | 8/2004 | Niu et al. |
| 6,943,900 B2 | 9/2005 | Niu et al. |
| 6,999,254 B1 | 2/2006 | Phan et al. |
| 7,043,397 B2 | 5/2006 | Johnson |
| 7,072,049 B2 | 7/2006 | Niu et al. |

(Continued)

FOREIGN PATENT DOCUMENTS

EP    0448890 A1    10/1991

(Continued)

OTHER PUBLICATIONS

Sarkar,M. "Modular Pattern Classifiers: A Brief Survey" IEEE 2000.*

(Continued)

*Primary Examiner*—David Vincent
*Assistant Examiner*—Benjamin Buss
(74) *Attorney, Agent, or Firm*—Morrison & Foerster LLP

(57) ABSTRACT

Split machine learning systems can be used to generate an output for an input. When the input is received, a determination is made as to whether the input is within a first, second, or third range of values. If the input is within the first range, the output is generated using a first machine learning system. If the input is within the second range, the output is generated using a second machine learning system. If the input is within the third range, the output is generated using the first and second machine learning systems.

21 Claims, 8 Drawing Sheets

U.S. PATENT DOCUMENTS

| | | | |
|---|---|---|---|
| 7,092,110 | B2 | 8/2006 | Balasubramanian et al. |
| 7,126,700 | B2 | 10/2006 | Bao et al. |
| 7,158,896 | B1 | 1/2007 | Singh et al. |
| 7,186,650 | B1 | 3/2007 | Dakshina-Murthy |
| 7,216,045 | B2 | 5/2007 | Doddi et al. |
| 7,224,456 | B1 | 5/2007 | Phan et al. |
| 7,224,471 | B2 | 5/2007 | Bischoff et al. |
| 7,280,229 | B2 | 10/2007 | Li et al. |
| 2004/0017574 | A1 | 1/2004 | Vuong et al. |
| 2004/0267397 | A1* | 12/2004 | Doddi et al. ............... 700/110 |
| 2005/0057748 | A1 | 3/2005 | Vuong et al. |
| 2005/0192914 | A1 | 9/2005 | Drege et al. |
| 2005/0209816 | A1 | 9/2005 | Vuong et al. |
| 2007/0185684 | A1 | 8/2007 | Vuong et al. |

OTHER PUBLICATIONS

Brooks, R.A "How to Build Complete Creatures Rather than Isolated Cognitive Simulators" MIT AI Lab. 1991.*

Horswill,I.D. "Functional Programming of Behavior-Based Systems" 2000.*

Horswill,I.D. "Conflict Resolution" 2000.*

Dietterich,T.G. "Machine Learning Research: Four Current Directions" 1997.* van Halteren,H. et al. "Improving Accuracy in Wordclass Tagging through Combination of Machine Learning Systems" Computational Linguistics. 2001.* del Jesus,M.J. et al. "Induction of Fuzzy-Rule-Based Classifiers with Evolutionary Boosting Algorithms" IEEE Trans. on Fuzzy Systems, vol. 12, No. 3. Jun. 2004.*

Goodridge,S.G. et al. "Fuzzy Behavior Fusion for Reactive Control of an Autonomous Mobile Robot: MARGE" IEEE. 1994.*

Rowe,N.C. "Plan Fields and Real-World Uncertainty" AAAI Spring Symposium on Planning in Uncertain, Unpredictable, or Changing Environments. Mar. 1990. Accessed using Archive.org on Jun. 21, 2007; Archive version: Nov. 21. 2002.*

Haykin, S. (1999). *Neural Networks*. 2nd edition, M. Horton ed., Prentice Hall: Upper Saddle River, New Jersey, 9 pages (Table of Contents).

Arthur, G. G. et al. (1997). "Enhancing the Development Rate Model for Optimum Simulation Capability in the Subhalf-Micron Regime," *Proceedings of SPIE* 3049:189-200.

Gahegan, M. et al. (1999). "Dataspaces as an Organizational Concept for the Neural Classification of Geographic Datasets," GeoComputation, located at <http://www.geovista.psu.edu/sites/geocomp99/Gc99/011/gc_011.htm>visited on Aug. 14, 2007, (8pages).

International Search Report and Written Opinion mailed May 16, 2005, for PCT Application No. PCT/US04/20682 filed Jun. 25, 2004, 7 pages.

Keeman, V. (2005). "Support Vector Machine - An Introduction" *In Support Vector Machines: Theory and Applications*. Wang, L. ed., Springer-Verlag Berlin Heidelberg: The Netherlands, pp. 1-47.

Platt, J. C. (1999). "Fast Training of Support Vector Machines Using Sequential Minimal Optimization" Chapter 12 *In Advances in Kernel Methods: Support Vector Learning*. Schölkopf et al. eds., MIT Press: Cambridge, MA, pp. 185-208.

Press, W. H. et al. (1992). *Numerical Recipes in C: The Art of Scientific Computing*. Cambridge University Press, 2nd edition, 8 pages (Table of Contents).

United States Patent Application No. 11/729,498, filed Mar. 28, 2007 for Bischoff et al.

United States Patent Application No. 11/786,869, filed Apr. 12, 2007 for Jin et al.

United States Patent Application No. 11/786,870, filed Apr. 12, 2007 for Jin et al.

United States Patent Application No. 11/787,025, filed Apr. 12, 2007 for Jin et al.

Vapnik, V. N. (1998). *Statistical Learning Theory*. John Wiley & Sons, Inc., 15 pages (Table of Contents).

\* cited by examiner

SPLIT MACHINE LEARNING SYSTEMS

BACKGROUND

1. Field

The present application relates to machine learning systems, and, more particularly, to using split machine learning systems to generate an output for an input.

2. Related Art

Machine learning systems have been used in a variety of applications. Typically, a machine learning system is configured to receive an input and generate an output for the received input using a learned relationship. The machine learning system maps, via the learned relationship, received members of an input set to members of an output set. In some cases, the input set may be viewed as a domain of a function and the output set may be viewed as a range of the function, where the function is the learned relationship.

When the input set is relatively small and uncomplicated, a single machine learning system may be efficiently trained on the learned relationship to accurately map each member of the input set to a member of the output set. However, as the size and complexity of the input set increases, the training time required for the single machine learning system also increases. Additionally, a large and complex input set can result in a poorly trained machine learning system.

SUMMARY

In one exemplary embodiment, split machine learning systems can be used to generate an output for an input. When the input is received, a determination is made as to whether the input is within a first, second, or third range of values. If the input is within the first range, the output is generated using a first machine learning system. If the input is within the second range, the output is generated using a second machine learning system. If the input is within the third range, the output is generated using the first and second machine learning systems.

DETAILED DESCRIPTION

The following description describes numerous exemplary configurations, parameters, and the like. It should be recognized, however, that such description is not intended as a limitation on the scope of the present invention or applications thereof, but instead provides examples and illustrations of exemplary embodiments.

Figure 1:
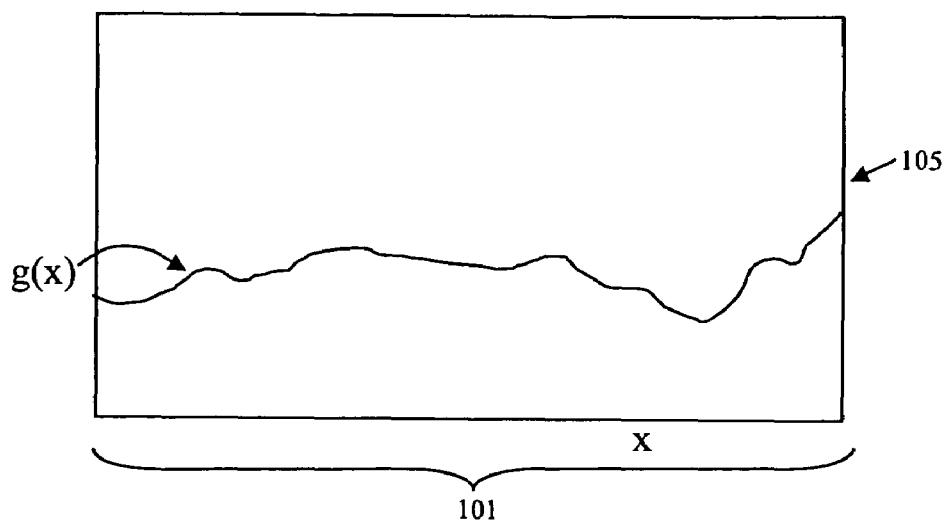
FIG. 1 illustrates a mapping of members of an input set by a function g to members of an output set.

FIG. 1 illustrates an exemplary mapping 105 of a set of inputs (input set 101) to a set of outputs (an output set). For simplicity, input set 101 is illustrated to be a domain (denoted by x). A domain has a set of members that can be connected without resorting to including elements that are not members of the set. A domain can be, for example, the set of real numbers greater than 0 and less than 100. The mapping between members of the input set and members of the output set is determined by function g, resulting in the output set being g(x). Although illustrated with this simple example, all description and discussion of mappings, functions, domains, and ranges is generic to any mapping between members of one set and another set, whether or not those sets are connected. Sets may be continuous or discrete, finite or infinite, real or complex, and the like.

Other input sets may have members describable by any number of variables. For example, members of an input set may be describable by two variables, and such an input set may be said to have two dimensions. Also, input sets may have an inherent ordering or structure. For example, each member of the domain x in FIG. 1 has a relative ordering with respect to other members, where the ordering is described by the value of the variable x associated with each member. In some cases, the ordering may be specified for some of the variables that describe members of the input set. Thus, terms of relative size as used herein refer to such relative orderings, the details of which are discernable by one of ordinary skill in related arts from context of use.

Figure 2:
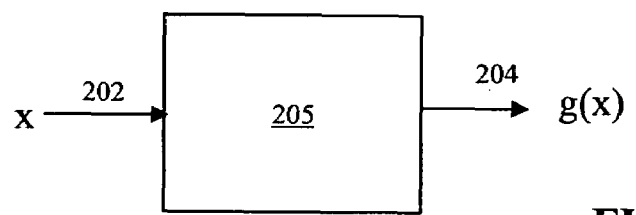
FIG. 2 illustrates a machine learning system for learning the mapping illustrated in FIG. 1.
Figure 3:
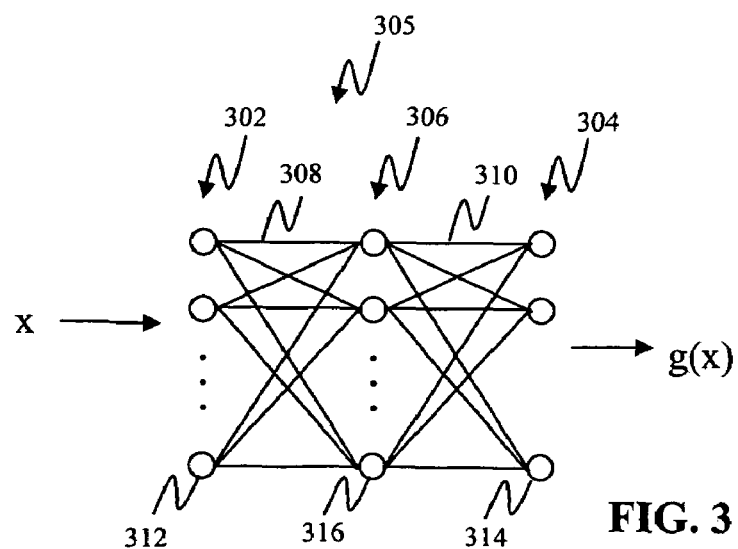
FIG. 3 illustrates a typical machine learning system architecture for use in the machine learning system of FIG. 2.

A machine learning system may be trained to learn the mapping of members of input set 101 to members of the output set g(x). FIG. 2 illustrates an exemplary machine learning system 205 that may be trained on mapping g(x). Machine learning system 205 includes an input port 202 and an output port 204. FIG. 3 illustrates a machine learning system implemented as a neural network 305, which uses a back-propagation algorithm. Neural network 305 includes an input layer 302, an output layer 304, and a hidden layer 306 between input layer 302 and output layer 304. Input layer 302 and hidden layer 306 are connected using links 308. Hidden layer 306 and output layer 304 are connected using links 310. Neural network 305 may include any number of layers connected in various configurations.

With reference again to FIG. 2, machine learning system 205 may be trained, typically in a training phase, by various training mechanisms to map inputs received on input port 202, the inputs being members of the domain x, into members of g(x) for output on output port 204. Thus, machine learning system 205 learns to map members of the domain x into appropriate members of g(x) such that after training (such as in an operational phase) input port 202 may be presented with any member of the domain x and machine learning system 205 would produce an acceptable output determined by the learned mapping. As is understood in the art, the learning of a machine learning system 205 is not entirely deterministic or precise, and an output from machine learning system 205 may vary within an acceptable range. And typically, where the output does not fall within that acceptable range, further training may be conducted.

During the training phase, machine learning system 205 may be serially presented with a sampling of members of the input set, output produced in response to the serially presented sampling is compared with a desired output, and training corrections are made as required to the architecture of machine learning system 205 or to weights amongst portions of machine learning system 205 (e.g., to weighting of links 308 (FIG. 3) and/or links 310 (FIG. 3)). For a more detailed description of machine learning systems and algorithms, see "Neural Networks" by Simon Haykin, Prentice Hall, 1999, which is incorporated herein by reference in its entirety. See also, U.S. patent application Ser. No. 10/608,300, filed Jun. 27, 2003, which is incorporated herein by reference in its entirety, and U.S. patent application Ser. No. 10/791,046, filed Mar. 1, 2004, which is incorporated herein by reference in its entirety.

As described above, if the input set is relatively large, if the output changes dramatically for small changes in input, or both, it may prove difficult to train machine learning system 205 so as to produce output having a desired mapping accuracy for all members of the input set. As used from henceforth, an "input" to machine learning system 205 (or other machine learning system) is understood to indicate one or more members of an input set (e.g., input set 101). The input to machine learning system 205 may be in a training phase or in an operational phase.

In one exemplary embodiment, an input set may be subdivided into multiple subsets, and a different machine learning system may be trained on each subset to map members of that subset to appropriate members of an associated output set. Thus, for an input from one subset of the input set, the machine learning system trained on that subset would map that input to an output. By dividing the input set, any one machine learning system need learn only a portion of the entire input set, which may allow training to proceed more rapidly and ultimately produce more accurate results.

Figure 4A:
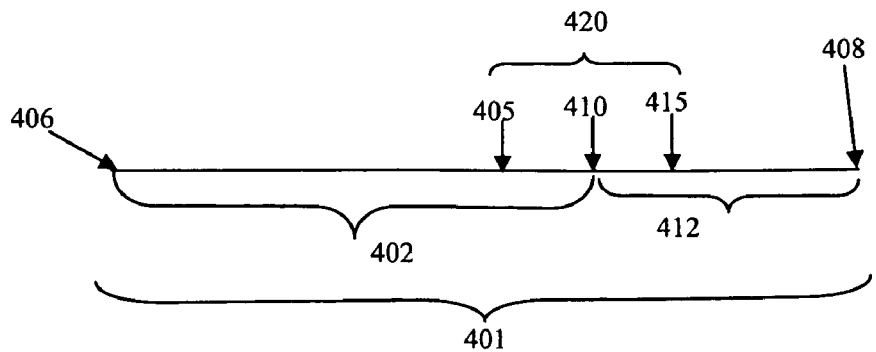
FIG. 4a illustrates an exemplary subdivided input set.

For example, FIG. 4a illustrates an input set 401 divided into multiple subsets. The input set 401 illustrated in FIG. 4a includes members describable by a single variable (x). A first subset 402 is demarcated by limits 406 and 410. A second subset 412 is demarcated by limits 410 and 408. A boundary domain 420 is demarcated by limits 405 and 415. A portion of first subset 402 is demarcated by limits 405 and 410. Likewise, a portion of second subset 412 is demarcated by limit 410 and 415. Thus, the members of the input set between limit 405 and limit 415 are members of boundary domain 420.

As illustrated in FIG. 4a, the range of values for variable (x) in input set 401 is divided into three ranges. The first range extends from limit 406 to limit 405. The second range extends from limit 415 to limit 408. The third range extends between limits 405 and 415. In the present example, a first portion of the third range is defined between limits 405 and 410. A second portion of the third range is defined between limits 410 and 415. Note, in the present example, first subset 402 corresponds to the first range and the first portion of the third range, and second subset 412 corresponds to the second range and the second portion of the third range.

Here, the input set is describable by the single variable x, and limit 405 need only be a single member of input set 401, and likewise limit 415 need only be a single member of input set 401. Of course, either or both limits 405, 415 may comprise more than one member of input set 401.

Figure 4B:
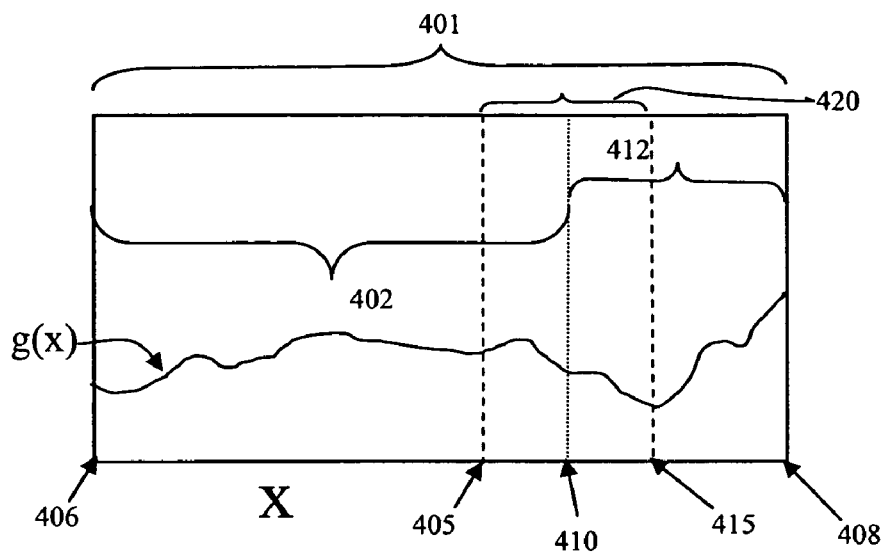
FIG. 4b illustrates the input set of FIG. 4a mapped into an output set.

FIG. 4b illustrates an exemplary mapping between input set 401 and an output set by function g(x). Usage of the various subsets of input set 401 will be described in further detail with regard to FIGS. 6-11.

Figure 4C:
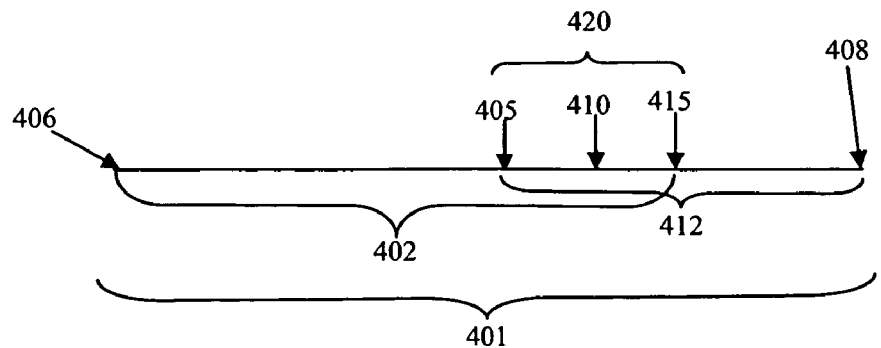
FIG. 4c illustrates another exemplary subdivided input set.

It should be recognized that first and second subsets 402, 412 can overlap within boundary domain 420. For example, FIG. 4c illustrates first subset 402 extending from limit 406 to limit 415, and second subset 412 extending from limit 405 to limit 408. FIG. 4c illustrates first and second subsets 402, 412 overlapping over the entire range of boundary domain 420. Note, however, that first and second subsets 402, 412 can overlap over only a portion of boundary domain 420.

Figure 5:
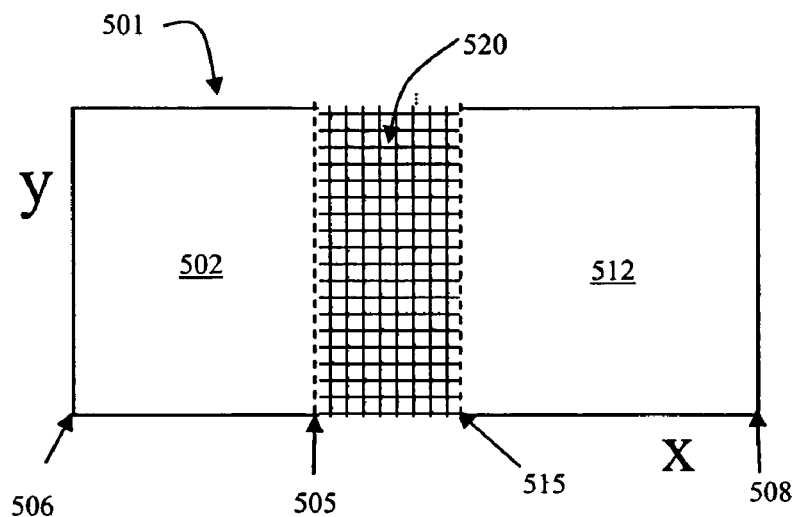
FIG. 5 illustrates another exemplary subdivided input set.

FIG. 5 provides an example of dividing an input set described by more than a single variable into multiple subsets and provision of a boundary domain dividing the subsets. Input set 501 is describable by two variables (x and y), and is divided into a first subset 502 and a second subset 512. Because each member of input set 501 requires two variables for specification, a first limit 505 and a second limit 515 are each a subset of members of input set 501 (by contrast with input set 401 (FIG. 4a), where the limits were each a single member of input set 401 (FIG. 4a)). In the present example, variable x is fixed at a respective value for each member of first limit 505 and second limit 515, while variable y may assume different values for different members. In other examples, both variables may vary amongst members of first limit 505 and second limit 515. This variance may be constant, such that graphs of first limit 505 and second limit 515 would be parallel lines with a constant slope.

Having thus divided each of input set 401 (FIGS. 4a-4c) and input set 501 into respective first subsets 402 (FIGS. 4a-4c) and 502, and second subsets 412 (FIGS. 4a-4c) and 512, exemplary systems and methods that employ these constructs will be described with regard to FIGS. 6-11. For ease of reference, the discussion will refer to FIGS. 4a-4c and elements related thereto, but it is understood that the discussion is equally applicable to FIG. 5 and related elements.

Figure 6:
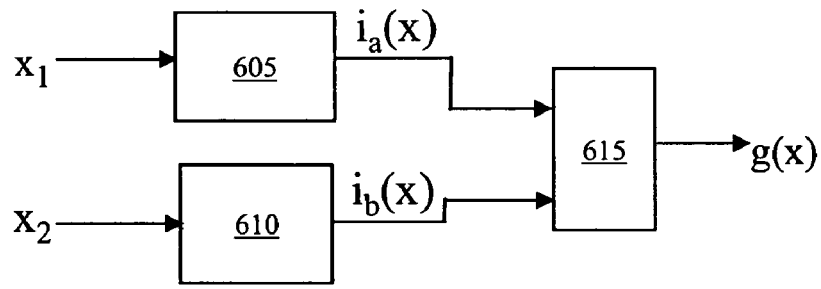
FIG. 6 illustrates an exemplary apparatus for training and operation with the input sets of FIGS. 4-5.

FIG. 6 depicts a first machine learning system 605 trained to map inputs ($x_1$) from a first subset of the input set into first intermediate outputs $i_a(x)$. A second machine learning system 610 is trained to map inputs ($x_2$) from a second subset of the input set into second intermediate outputs $i_b(X)$. This training typically occurs in a training phase over at least a sampling of inputs from the first subset and the second subset. As described above, a boundary domain is defined to include a portion of the first subset and a portion of the second subset. Thus, first and second machine learning systems 605, 610 are trained for inputs that are from the boundary domain.

For example, with reference to FIG. 4a, if first subset 402 and second subset 412 do not overlap within boundary domain 420, then first learning system 605 (FIG. 6) is trained over a sampling of inputs from the first range, which extends from limit 406 to limit 405, and the first portion of the third range, which extends from limit 405 to limit 410. Second learning system 610 (FIG. 6) is trained over a sampling of inputs from the second range, which extends from limit 415 to limit 408, and the second portion of the third range, which extends from limit 410 to limit 415. Thus, because first and second subsets 402, 412 do not overlap within boundary domain 420, first and second learning systems 605, 610 (FIG. 6) are trained over portions of boundary domain 420 that are separate and distinct.

However, with reference to FIG. 4c, if first subset 402 and second subset 412 do overlap within boundary domain 420, then first and second learning systems 605, 610 (FIG. 6) are trained over portions of boundary domain 420 that overlap. In particular, in the example depicted in FIG. 4c, first and second subset 402, 412 completely overlap within boundary domain 420. Thus, first and second learning systems 605, 610 (FIG. 6) are both trained over the entire range within boundary domain 420, which includes the first and second portions of boundary domain 420 described above.

With reference again to FIG. 6, under ideal training conditions, in response to input of the same member of boundary domain 420 (FIG. 4c), first machine learning system 605 and second machine learning system 610 should each produce an identical intermediate output. However, as discussed above, first machine learning system 605 and second machine learning system 610 may each have learned to map members of boundary domain 420 (FIG. 4c) into different intermediate outputs. For some members, intermediate output $i_a(x)$ of first machine learning system 605 may be more accurate, and for other members intermediate output $i_b(x)$ may be more accurate, while for still other members, neither intermediate output $i_a(x)$ or $i_b(x)$ may be accurate enough.

Because first machine learning system 605 was trained to map first subset 402 (FIG. 4c) members, first machine learning system 605 is expected to be able to more accurately map members of boundary domain 420 (FIG. 4c) that are part of first subset 402 (FIG. 4c) than second machine learning system 610, and vice versa for second machine learning system 610 and members of boundary domain 420 (FIG. 4c) that are part of second subset 412 (FIG. 4c). However, when first and second subsets 402, 412 (FIG. 4c) overlap within boundary domain 420 (FIG. 4c), because first machine learning system 605 was trained on members of boundary domain 420 that are also members of second subset 412 (FIG. 4c), first machine learning system 605 provides useful information in determining a final output g(x) for those inputs that are members of boundary domain 420 (FIG. 4c) and second subset 412 (FIG. 4c). Conversely, second machine learning system 610 was trained on members of boundary domain 420 (FIG. 4c) that are also members of first subset 402 (FIG. 4c), and therefore second machine learning system 610 provides useful information in determining a final output g(x) for those inputs that are members of both boundary domain 420 (FIG. 4c) and also second subset 402 (FIG. 4c).

In the present exemplary embodiment, an interface 615 connected to first and second learning systems 605, 610 is configured to generate an output for an input using first machine learning system 605, second machine learning system 610, or both first and second machine learning system 605, 610. In particular, interface 615 is configured to receive an input, then determine if the input is within a first, second, or third range of values.

For example, as described above, with reference to FIGS. 4a-4c, the range of values for variable (x) in input set 401 is divided into three ranges (i.e., the first range extending from limit 406 to limit 405, the second range extending from limit 415 to limit 408, and the third range extending from limit 405 to limit 415). With reference again to FIG. 6, if the input is within the first range, interface 615 generates an output using only first machine learning system 605. If the input is within the second range, interface 615 generates an output using only second machine learning system 610. If the input is within the third range, interface 615 generates an output using both first and second machine learning system 605, 610.

Figure 7:
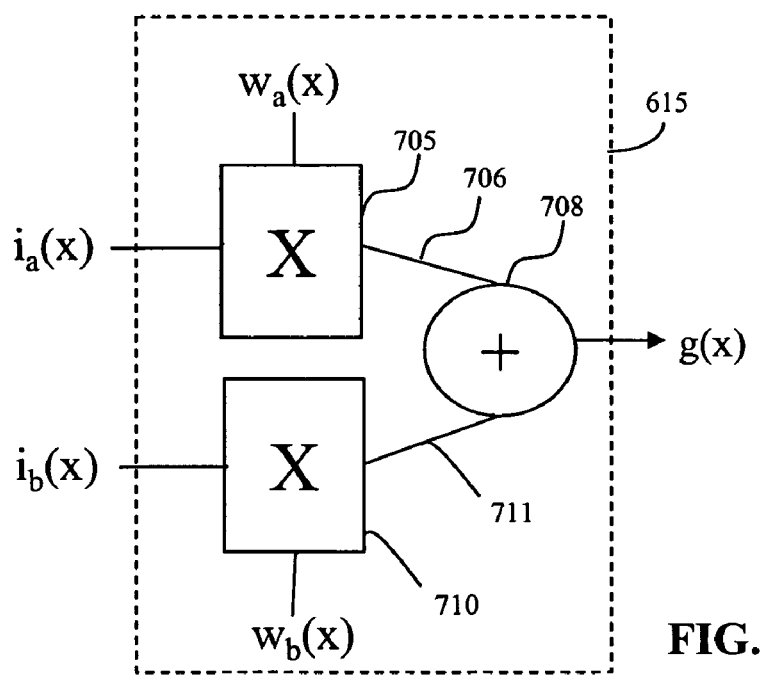
FIG. 7 illustrates exemplary weighting of FIG. 6.

In particular, with reference to FIG. 7, when the input is within the third range, which corresponds to boundary domain 420 (FIGS. 4a-4c), interface 615 generates a final output g(x) from intermediate outputs $i_a(x)$ and $i_b(x)$ of first and second machine learning systems 605, 610 (FIG. 6). As FIG. 7 illustrates, intermediate outputs $i_a(X)$ and $i_b(x)$ are inputted into weighting elements 705, 710, respectively, to produce weighted outputs 706, 711, respectively. Weighted outputs 706, 711 are summed in a summing element 708, to generate the final output g(x).

In one exemplary embodiment, intermediate output $i_a(x)$ is multiplied with a weighting value $W_a(x)$ determined according to a relative position within the third range of values for input $x_1$. By example, an intermediate output $i_a(x)$ for an input $x_1$ close to limit 405 (FIGS. 4a-4c) would be multiplied with a larger weighting value than intermediate output $i_b(x)$ for that input. By further example, intermediate output $i_a(x)$ and intermediate output $i_b(x)$ may be multiplied with an equal weighting value for an input near limit 410 (FIGS. 4a-4c). Similar discussion applies for intermediate output $i_b(x)$, which is multiplied with a weighting value $W_b(x)$. Preferably, weighting values for intermediate output $i_a(x)$ and intermediate output $i_b(x)$ should sum approximately to unity. Weighting values for $i_b(x)$ and $i_a(x)$ may be determined by one or more weighting functions.

With reference to FIGS. 4a-4c, before describing an exemplary weighting function, further qualitative description of weighting values for portions of input set 401 is useful. For inputs in first subset 402 not between limits 405 and 410 (i.e., for inputs between limits 406 and 405), intermediate output $i_a(x)$ may be weighted approximately unity while intermediate output $i_b(x)$ may be approximately null weighted. Likewise, for inputs in second subset 412 not between limits 415 and 410 (i.e., for inputs between limits 415 and 408), intermediate output $i_b(x)$ may be approximately unity weighted while intermediate output $i_a(x)$ may be approximately null weighted.

A decision may also be made to bypass weighting entirely for such inputs and only output the intermediate output which would have been about unity weighted (e.g., for inputs between limits 406 and 405, intermediate output $i_a(x)$ would be outputted as the final output and intermediate output $i_b(x)$ would not be used in formulating the final output). Such strategies reflect the expectation that intermediate output $i_a(x)$ is much more accurate for inputs between limits 406 and 405 and that intermediate output $i_b(x)$ is much more accurate for inputs between limits 415 and 408. Based on this expectation, other strategies for weighting intermediate output $i_a(x)$ and intermediate output $i_b(x)$ accordingly may be devised by one of ordinary skill in the art.

Figure 8:
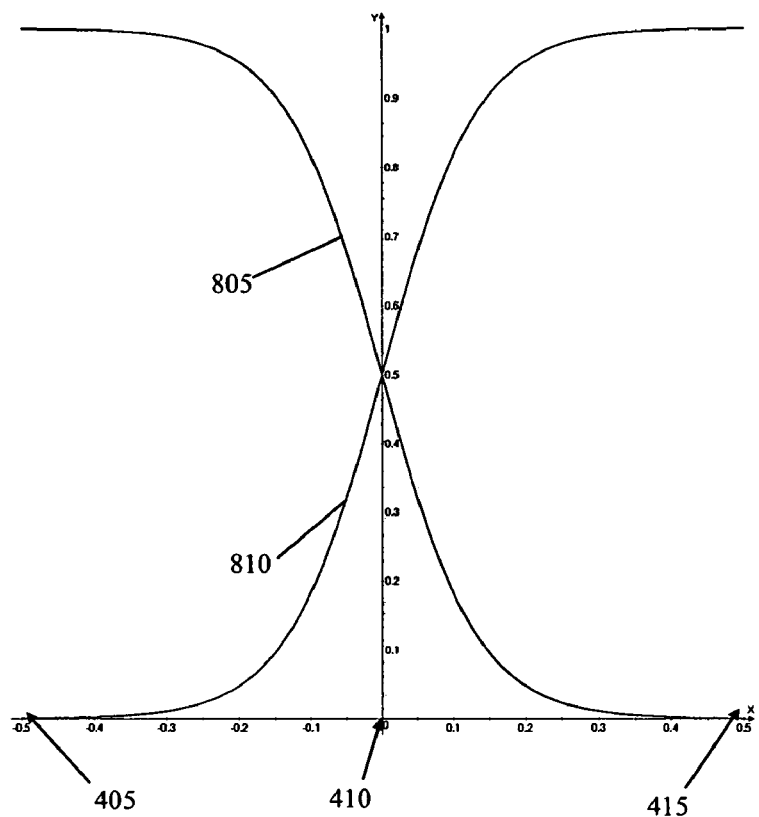
FIG. 8 illustrates exemplary weighting functions.

FIG. 8 illustrates an exemplary weighting function 805 for weighting intermediate output $i_a(X)$ generated by first machine learning system 605 (FIG. 6) based on inputs in boundary region 420 (FIGS. 4a-4c). Weighting function 805 is defined by the following equation:

$$W(x) = \frac{1}{1 + e^{k\left(\frac{x-l_0}{l_2-l_1}\right)}}.$$

In the above equation, $l_1$ is the lower limit of boundary region 420 (FIGS. 4a-4c), which corresponds to limit 405 (FIGS. 4a-4c), $l_2$ is the upper limit of boundary region 420 (FIGS. 4a-4c), which corresponds to limit 415 (FIGS. 4a-4c), $l_0$, is the average of $l_1$ and $l_2$, and k is a constant value.

Figure 9:
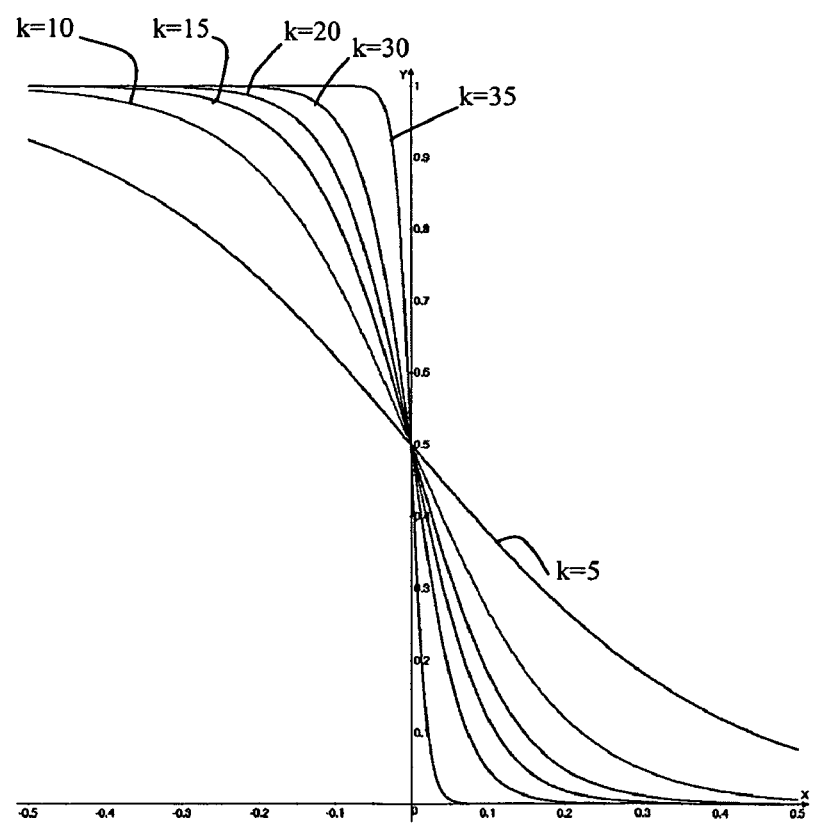
FIG. 9 illustrates an exemplary parameterized family of curves of which one or more may be selected as weighting functions according to FIGS. 7-8.

FIG. 9 illustrates a family of weighting functions generated by varying the value of constant k. As illustrated, increasing constant k provides a weighting function with a steeper slope, but which still passes through ½ at limit 410 (FIGS. 4a-4c). Thus, higher k valued weighting functions result in less blending of intermediate outputs $i_a(x)$ and $i_b(x)$ respectively of first machine learning system 605 (FIG. 6) and second machine learning system 610 (FIG. 6). An amount of blending of intermediate outputs $i_a(x)$ and $i_b(x)$ may be selected for a given application, and for many applications a degree of blending resulting from k between approximately 10 and 25 is preferable.

FIG. 8 also illustrates an exemplary weighting function 810 for weighting intermediate output $i_b(x)$ generated by second machine learning system 610 (FIG. 6) based on inputs in boundary region 420 (FIGS. 4a-4c). Weighting function 810 is $(1-W(x))$.

Thus, as illustrated, weighting function 805 and weighting function 810 are approximately symmetric about limit 410 (FIGS. 4a-4c) and generally sum to approximately unity. Exemplary weighting function 805 and weighting function 810 have non-linear slopes at each of limit 405 (FIGS. 4a-4c) and limit 415 (FIGS. 4a-4c), and approximately linear slopes near limit 410 (FIGS. 4a-4c). It should be recognized, however, that weighting function 805 and weighting function 810 may be chosen by a variety of methods and may be different for different applications and may be selected through testing for which function type yields superior results in a given application.

The above examples were of an input set describable by one or more variables, but divided into two subsets by one boundary domain. There may also be cases where an input set is subdivided into a plurality of subsets by multiple boundary domains. Each boundary domain may also be describable by more than one variable (have more than one dimension), and one or more of those variables may be fixed for each boundary domain. Each boundary domain may also intersect such that some boundary domains share members in common with other boundary domains. A weighting function may be defined as the product of weighting factors (e.g., weighting function 805 (FIG. 8)) for each variable in each boundary domain. Where multiple boundary domains intersect, the sum of all weighting functions is preferably one, which prevents scaling of the output.

Figure 10A:
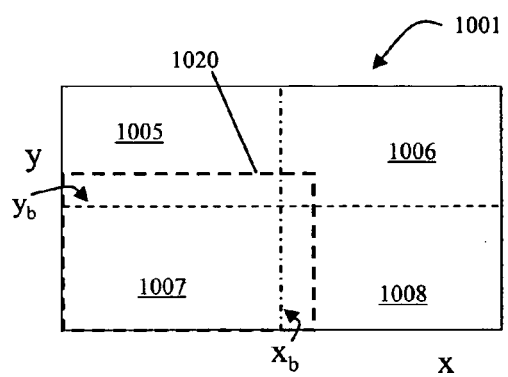
FIGS. 10a-d illustrate training boundaries for a plurality of subsets of an input set describable by two variables.

An exemplary division of an input set having multiple variables (multiple dimensions) into multiple subsets by creation of multiple boundary domains is described below with reference to FIGS. 10a-d. In particular, FIG. 10a illustrates a graphical representation of an input set 1001 describable by two variables (x and y). Quadrants 1005-1008 are identified in respective corners of input set 1001 and are formed by a boundary in the x dimension ($x_b$) and a boundary in the y dimension ($y_b$).

Figure 10B:
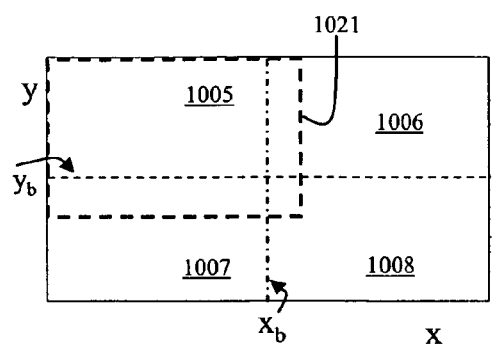
Figure 10C:
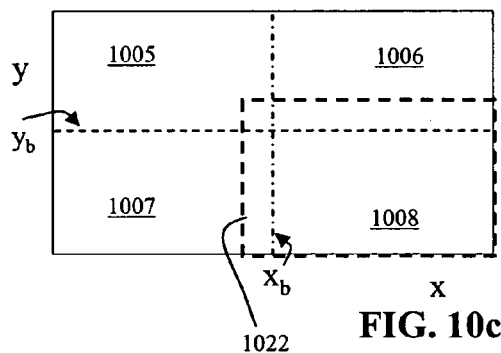
Figure 10D:
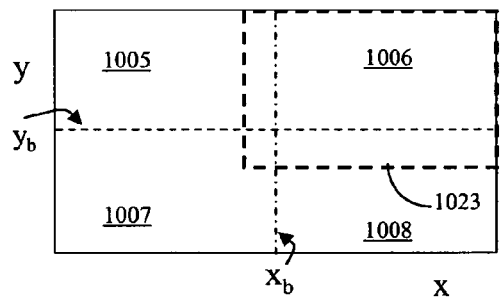

FIG. 10a further illustrates a first subset 1020 on which a first machine learning system is trained. FIG. 10b illustrates a second subset 1021 on which a second machine learning system is trained. FIG. 10c illustrates a third subset 1022 on which a third machine learning system is trained. FIG. 10d illustrates a fourth subset 1023 on which a fourth machine learning system is trained.

Figure 10E:
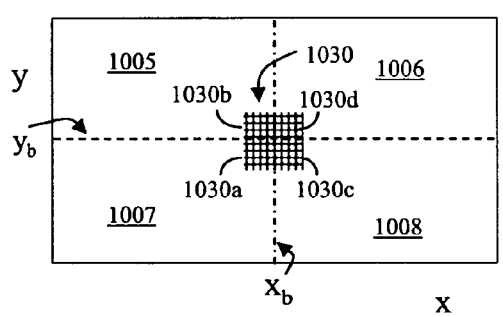
FIGS. 10e-h illustrate overlap domains of the subsets illustrated in FIGS. 10a-d.

FIG. 10e depicts a boundary domain 1030 with quadrants corresponding to portions of subsets 1020-1023. In the present exemplary embodiment, subsets 1020-1023 overlap completely within boundary domain 1030. It should be recognized, however, that subsets 1020-1023 can overlap partially or not at all within boundary domain 1030.

In one exemplary embodiment, if the input is within boundary domain 1030, the output is generated by weighting intermediate outputs by the first, second, third, and fourth machine learning systems. In particular, if the input is within a first quadrant 1030a of boundary domain 1030, the intermediate output generated by the first machine learning system is weighted more heavily than the intermediate output generated by the second, third, or fourth machine learning system. If the input is within a second quadrant 1030b of boundary domain 1030, the intermediate output generated by the second machine learning system is weighted more heavily than the intermediate output generated by the first, third, or fourth machine learning system. If the input is within a third quadrant 1030c of boundary domain 1030, the intermediate output generated by the third machine learning system is weighted more heavily than the intermediate output generated by the first, second, or fourth machine learning system. If the input is within a fourth quadrant 1030d of boundary domain 1030, the intermediate output generated by the fourth machine learning system is weighted more heavily than the intermediate output generated by the first, second, or third machine learning system.

Figure 10F:
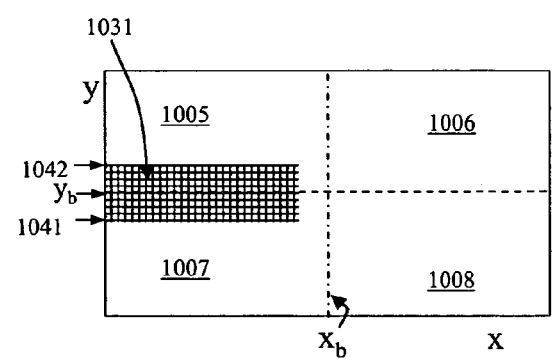

FIG. 10f illustrates a boundary domain 1031 defined between subsets 1020, 1021 (FIGS. 10a, 10b). A similar boundary domain (not separately illustrated) is also defined between subsets 1022, 1023 (FIGS. 10c, 10d). Boundary domain 1031 is defined by a lower limit 1041 (analogous to limit 405 (FIGS. 4a-4c)) and an upper limit 1042 (analogous to limit 415 (FIGS. 4a-4c)). For inputs within boundary domain 1031, intermediate outputs generated by the first and second machine learning systems are weighted to generate an output. In particular, in one exemplary embodiment, for inputs between lower limit 1041 and $y_b$ (analogous to limit 410 (FIGS. 4a-4c)), the intermediate output generated by the first machine learning system is weighted more heavily than the intermediate output generated by the second machine learning system. For inputs between $y_b$ and upper limit 1042, the intermediate output generated by the second machine learning system is weighted more heavily than the intermediate output generated by the first machine learning system.

Figure 10G:
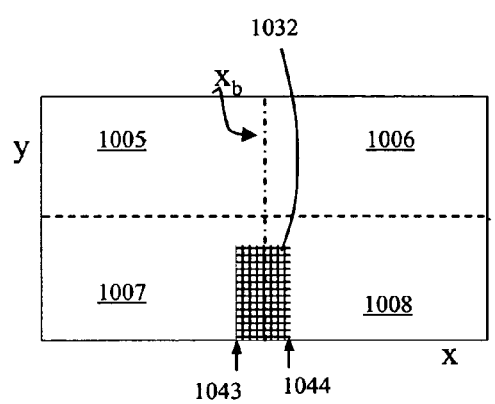
Figure 10H:
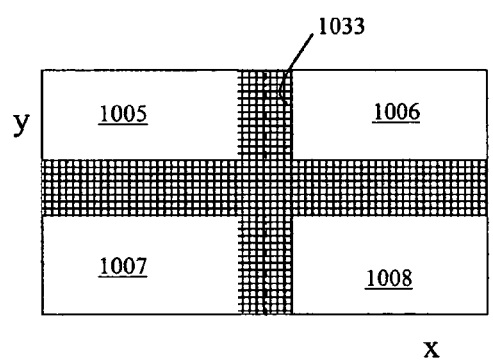

FIG. 10g illustrates a boundary domain 1032 defined between subsets 1020, 1022 (FIGS. 10a, 10c). A similar boundary domain (not separately illustrated) is also defined between subset 1021, 1023 (FIGS. 10b, 10d). Boundary domain 1032 is defined by a lower limit 1043 (analogous to limit 405 (FIGS. 4a-4c)) and an upper limit 1044 (analogous to limit 415 (FIGS. 4a-4c)). For inputs within boundary domain 1032, intermediate outputs generated by the first and third machine learning systems are weighted to generate an output. In particular, in one exemplary embodiment, for inputs between lower limit 1043 and $x_b$ (analogous to limit 410 (FIGS. 4a-4c)), the intermediate output generated by the first machine learning system is weighted more heavily than the intermediate output generated by the third machine learning system. For inputs between $x_b$ and upper limit 1044, the intermediate output generated by the third machine learning system is weighted more heavily than the intermediate output generated by the first machine learning system.

Note that as illustrated in FIGS. 10f, 10g, boundary domains 1031 and 1032 are illustrated as not including boundary domain 1030; this is for ease of description in how weighting values may be applied in those boundary domains as compared with boundary domain 1030. Conceptually, however, a union of all boundary domains may be considered as a single boundary domain, which is illustrated as a boundary domain 1033 in FIG. 10h.

Figure 11:
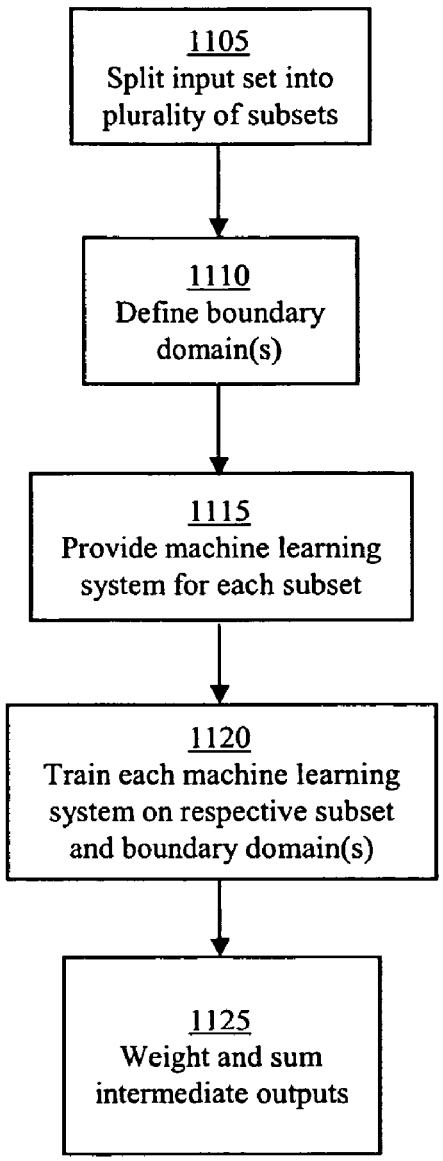
FIG. 11 illustrates steps of an exemplary method for training machine learning systems on subsets described with regard to FIGS. 4-10.

FIG. 11 depicts an exemplary process of using split machine learning systems. In step 1105, an input set having members describable by one or more variables is split into a plurality of subsets. The members of the input set are related to members of an output set through a predetermined mapping. In step 1110, one or more boundary domains are defined between the subsets. In step 1115, a machine learning system is provided for each subset identified in step 1105. In step 1120, each machine learning system is trained to map members of its subset and members of each boundary domain shared by that subset, and to produce an intermediate output. Training may occur on a sampling of all members of an appropriate subset or on all members of the subset.

In step 1125, each intermediate output is weighted according to which member of the input set was the basis for the intermediate output. For members of the input set not in a boundary domain, the intermediate output of the machine learning system trained on that member may be deemed a final output and the weighting apparatus may be bypassed for that intermediate output. Alternatively, the intermediate output of the machine learning system trained on that member is weighted at one and weight all other intermediate outputs at zero.

For members in a boundary domain shared by two subsets, weighting may occur in one variable only, even where the input set is divided into more than two subsets so long as those subsets are separated by one variable. For members in a boundary domain shared by more than two subsets, weighting may occur in two or more variables for subsets separated by two or more variables. Weighting values applied to all intermediate outputs for a given member of an input set preferably should sum to one.

Figure 12:
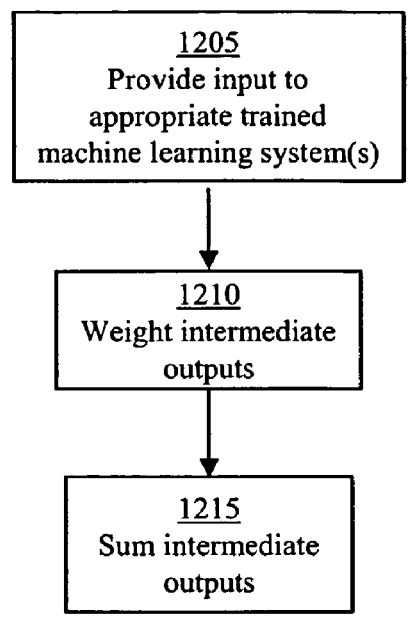
FIG. 12 illustrates steps of an exemplary method of operation for the machine learning systems of FIG. 11.

With reference to FIG. 12, an exemplary process is depicted of generating an output for an input using split machine learning systems. Step 1205 assumes that steps similar to steps of the method of FIG. 11 have been performed in advance. In operation, an input that is a member of the input set described in FIG. 11 is provided to one or more of the machine learning systems described in FIG. 11. In some cases, the input may be provided to all of the machine learning systems, but where the input is a member of one of the subsets described in FIG. 11 but not a member of any boundary domain, the input may be provided to only the machine learning system trained on that subset. In step 1210, intermediate outputs generated by the one or more machine learning systems to which the input was provided are weighted according to the location of the input in the input set (all as described above). In step 1215, the weighted intermediate outputs are then summed for producing a final output.

Figure 13:
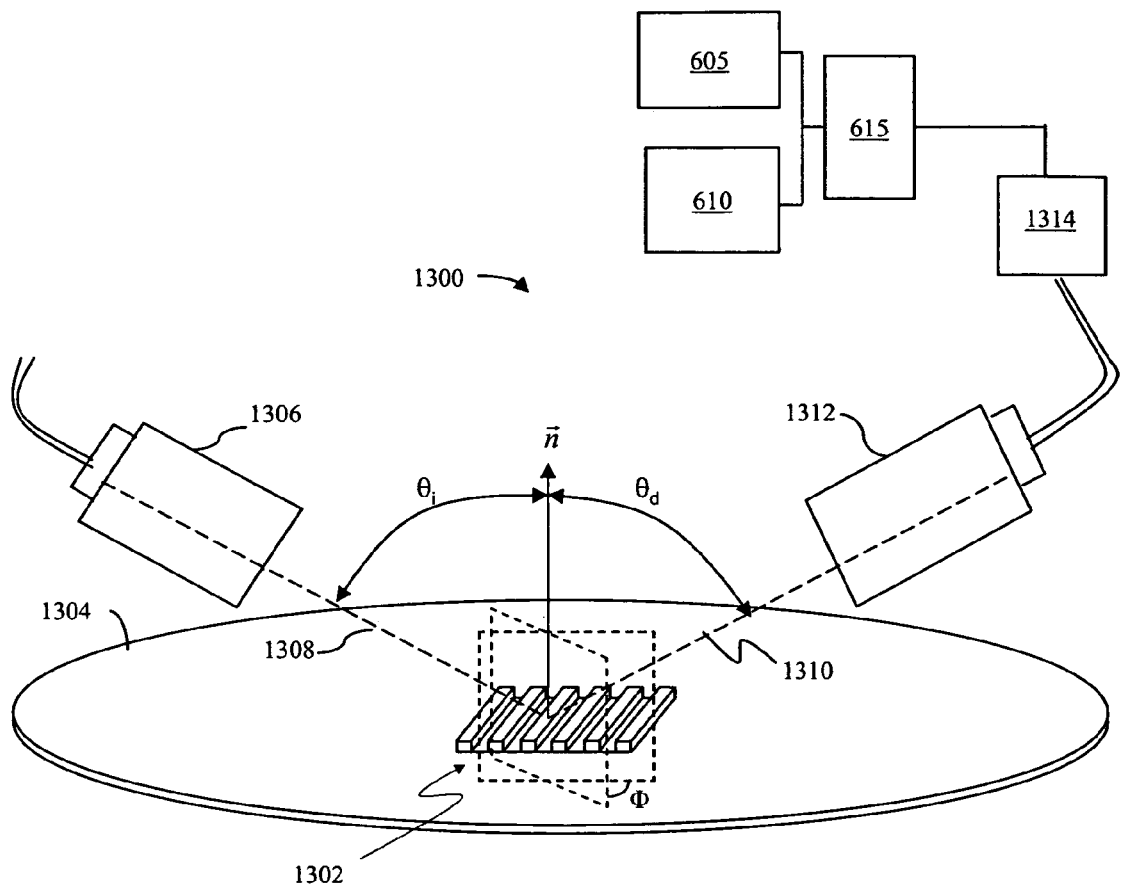
FIG. 13 illustrates an exemplary optical metrology system.

With reference to FIG. 13, in one exemplary embodiment, split machine learning systems are used in optical metrology of a structure formed on a semiconductor wafer. In particular, FIG. 13 depicts a metrology system 1300 used to examine a structure formed on a semiconductor wafer 1304. For example, metrology system 1300 can be used to determine a feature of a periodic grating 1302 formed on wafer 1304. Periodic grating 1302 can be formed in test areas on wafer 1304, such as adjacent to a device formed on wafer 1304. In examples, periodic grating 1302 can be formed in an area of the device that does not interfere with the operation of the device or along scribe lines on wafer 1304. It should be recognized that the structure being examined can be any type of structure formed on wafer 1304, including a feature of an integrated circuit device.

As depicted in FIG. 13, metrology system 1300 can include a metrology device, and in particular, an optical metrology device with a source 1306 and a detector 1312. Periodic grating 1302 is illuminated by an incident beam 1308 from source 1306. In the present example, incident beam 1308 is directed onto periodic grating 1302 at an angle of incidence $\theta_i$ with respect to normal $\vec{n}$ of periodic grating 1302 and an azimuth angle $\Phi$ (i.e., the angle between the plane of incidence beam 1308 and the direction of the periodicity of periodic grating 1302). Diffracted beam 1310 leaves at an angle of $\theta_d$ with respect to normal $\vec{n}$ and is received by detector 1312. It should be recognized that angles $\theta_i$ and $\theta_d$ can be zero with respect to normal $\vec{n}$. Detector 1312 converts the diffracted beam 1310 into a measured diffraction signal, which can include reflectance, tan ($\Psi$), cos ($\Delta$), Fourier coefficients, and the like. The measured diffraction signal can be analyzed in processing module 1314.

Figure 14:
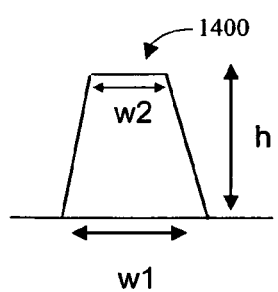
FIG. 14 illustrates an exemplary structure describable by three variables.

In particular, the profile of the structure can be characterized using a set of profile parameters. For example, FIG. 14 illustrates an exemplary structure 1400 characterized using three profile parameters: bottom width (w1), top width (w2), and height (h). Note that the widths w1 and w2 can be referred to as the bottom CD and top CD, respectively. It should be recognized that additional shapes and features of structure 1400 can be characterized by increasing the number of parameters, including angle of incident (AOI), pitch, n & k, hardware parameters (e.g., polarizer angle), and the like.

With reference again to FIG. 13, processor 1314 provides a set of profile parameters as an input to interface 615. Based on the received set of profile parameters, interface 615 generates a simulated diffraction signal corresponding to the set of profile parameters as an output using first machine learning system 605, second machine learning system 610, or both first and second machine learning systems 605, 610.

Processor 1314 then compares the simulated diffraction signal to the measured diffraction signal. If the diffraction signals match within a matching criterion, a feature of the structure is determined based on the one or more profile parameters used as the input to generate the matching simulated diffraction signal. If the diffraction signals do not match within the matching criterion, processor 1314 alters one or more of the profile parameters in the set of profile parameters, then generates another simulated diffraction signal to compare with the measured diffraction signal.

In one exemplary embodiment, when the input set includes a set of profile parameters, one or more of the set of profile parameters are selected and divided into subsets, such as a first subset and a second subset. For example, with reference to FIG. 14, assume the bottom width (w1) is selected. Also assume that bottom width (w1) can vary between a range of 60 nm to 100 nm. Further assume that bottom width (w1) is divided into a first subset of 60 nm to 80 nm and a second subset of 80 nm to 100 nm. Thus, in this example, with reference to FIG. 13, first machine learning system 605 is trained using the first subset of 60 nm to 80 nm, while second machine learning system 610 is trained using the second subset of 80 nm to 100 nm. Assume that the boundary domain (i.e., the third range) is set at 75 nm to 85 nm. Thus, for inputs (i.e., set of profile parameters) with a bottom width (w1) of between 60 to 75 nm, first machine learning system 605 is used to generate a simulated diffraction signal. For inputs with a bottom width (w1) of between 85 nm and 100 nm, second machine learning system 610 is used to generate a simulated diffraction signal. For inputs with a bottom width (w1) of between 75 nm and 85 nm, first and second machine learning systems 605, 610 are used to generate a simulated diffraction signal.

In the present exemplary embodiment, the one or more profile parameters to be divided are selected based on sensitivity of the one or more parameters. Sensitivity refers to the degree to which a change in that variable effects a change in the output. For mapping of an input set x to outputs g(x), sensitivity is related to slope of derivatives of g. For example, with reference to FIG. 14 again, assume that a 1 nm change in height would cause a noticeable change in the outputted simulated diffraction signal, while a 1 µm change in top width (w2) is required to effect a noticeable change in the outputted simulated diffraction signal. Under such assumptions, the height variable is 10 times more sensitive than the top width (w2) variable. Typically, it is preferable to split the input set so that the more sensitive variable is divided and members of different subsets share other variables in common.

In particular, Principal Component Analysis (PCA) can be used to determine sensitivity. One way to conceptualize PCA is that it identifies a predominant direction or variable in an input set (or any other data set). A predominant variable identified by using PCA should be split, such that subsets share other variables in common. PCA may also be used, of course, to reduce the dimensionality of the input set. Returning again to the optical metrology example, three variables may be used to describe a structure under analysis, and these three variables may not all be independent. PCA can be used to transform these three variables into another space in which all variables are independent. Division of that space into subsets by boundary domain(s) may also be done and machine learning systems trained according to aspects described above on the subsets and boundary domain(s).

Alternatively, the one or more profile parameters to be divided are selected based on the effective number of nodes (ENN). ENN is a measure of how many distinct simulated diffraction signals can be produced by stepping each variable from a lowest possible value to a highest possible value. The variable which produces the greater number of distinct simulated diffraction signals is a good candidate for division, such that subsets share variables other than that variable. A geometrical way to view this analysis is that a boundary should be chosen to make the subsets of the input set more square than the input set, where each step resulting in a distinct diffraction signal is uniformly spaced.

The one or more profile parameters to be divided can also be selected based on historical data. For example, if bottom width (w1) had been selected as the parameter to be divided in a past application, the bottom width (w1) is selected in the present application. It should be recognized, however, that the one or more profile parameters to be divided can be selected based on a combination of any of the criteria described above and any other suitable criteria.

In one exemplary embodiment, first and second machine learning systems 605, 610 can be trained to receive diffraction signals as inputs and generate sets of profile parameters as outputs based on the received diffraction signals. Thus, processor 1314 can provide the measured diffraction signal to interface 615. Using the measured diffraction signal as an input, interface 615 can generate a set of profile parameters corresponding to the measured diffraction signal using the first machine learning system 605, second machine learning system 610, or both first and second machine learning systems 605, 610.

As would be understood by those of skill in the art, the apparatuses described herein may be implemented by appropriately coded general purpose processors, by one or more ASICs, FPGAs, or a combination of general purpose processors and ASICS and FPGAs. Other computation architectures may be used where desirable.

The foregoing descriptions of specific embodiments have been presented for purposes of illustration and description. They are not intended to be exhaustive or to limit the present application to the precise forms disclosed, and it should be understood that many modifications and variations are possible in light of the above teaching.

We claim:

1. A method of using split machine learning systems to generate an output for an input, wherein the input includes a plurality of profile parameters of a structure formed on a semiconductor wafer, wherein the output is a simulated diffraction signal, which characterizes light diffracted from the structure, the method comprising:
    a) receiving the input;
    b) determining if the input is within a first, second, or third range of values, wherein the ranges are separate and distinct ranges each containing at least one value;
    c) if the input is within the first range, generating the output using a first machine learning system;
    d) if the input is within the second range, generating the output using a second machine learning system; and
    e) if the input is within the third range, generating the output using the first and second machine learning systems.

2. The method of claim 1, wherein the first machine learning system has been trained to generate outputs for inputs within the first range and at least a first portion of the third range, and wherein the second machine learning system has been trained to generate outputs for inputs within the second range and at least a second portion of the third range.

3. The method of claim 2, wherein the first and second portions are separate and distinct portions of the third range.

4. The method of claim 2, wherein the first machine learning system and the second machine learning system have been trained to generate outputs for inputs within the first portion and the second portion of the third range.

5. The method of claim 1, wherein e) comprises:
    generating a first intermediate output for the input using the first machine learning system;
    generating a second intermediate output for the input using the second machine learning system;
    weighting the first and second intermediate outputs; and
    summing the weighted first and second intermediate outputs to generate the output.

6. The method of claim 5, wherein:
    if the input is in a first portion of the third range, the first intermediate output is weighted more heavily than the second intermediate output; and
    if the input is in a second portion of the third range, the second intermediate output is weighted more heavily than the first intermediate output.

7. The method of claim 1, wherein the third range has a first limit bounded by the first range and a second limit bounded by the second range, wherein the weighting of the first intermediate output decreases from a maximum value when the input is at the first limit to a minimum value when the input is at the second limit, and wherein the weighting of the second intermediate output increases from a minimum value when the input is at the first limit to a maximum value when the input is at the second limit.

8. The method of claim 7, wherein the weighting of the first intermediate output is determined by a weight function (W(x)):

$$W(x) = \frac{1}{1 + e^{k\left(\frac{x-l_0}{l_2-l_1}\right)}},$$

wherein x is the location of the input within the third range, $l_1$ is the first limit, $l_2$ is the second limit, $l_0$ is the average of $l_1$ and $l_2$, and k is a constant value, and wherein the weighting of the second intermediate output is determined by (1−W(x)).

9. The method of claim 1, further comprising:
dividing a set of possible values for the input into a first subset and at least a second subset, wherein the first subset corresponds to the first range and at least a first portion of the third range, wherein the second subset corresponds to the second range and at least a second portion of the third range, wherein the first machine learning system has been trained to generate outputs for inputs within the first subset, and wherein the second machine learning system has been trained to generate outputs for inputs within the second subset.

10. The method of claim 9, further comprising:
dividing the set of possible values for the input into a third subset and a fourth subset, wherein a third machine learning system has been trained to generate outputs for inputs within the third subset, wherein a fourth machine learning system has been trained to generate outputs for inputs within the fourth subset.

11. The method of claim 10, wherein a boundary domain is defined with quadrants corresponding to portions of the first, second, third, and fourth subsets, and wherein, if the input is within the boundary domain, the output is generated by weighting intermediate outputs generated by the first, second, third, and fourth machine learning systems.

12. The method of claim 11, wherein:
if the input is within a first quadrant of the boundary domain, the intermediate output generated by the first machine learning system is weighted more heavily than the intermediate output generated by the second, third, or fourth machine learning system,
if the input is within a second quadrant of the boundary domain, the intermediate output generated by the second machine learning system is weighted more heavily than the intermediate output generated by the first, third, or fourth machine learning system,
if the input is within a third quadrant of the boundary domain, the intermediate output generated by the third machine learning system is weighted more heavily than the intermediate output generated by the first, second, or fourth machine learning system, and
if the input is within a fourth quadrant of the boundary domain, the intermediate output generated by the fourth machine learning system is weighted more heavily than the intermediate output generated by the first, second, or third machine learning system.

13. The method of claim 1, further comprising:
selecting at least one profile parameter from the plurality of profile parameters;
dividing a set of possible values for the selected profile parameter into a first subset and at least a second subset, wherein the first subset corresponds to the first range and at least a first portion of the third range, and wherein the second subset corresponds to the second range and at least a second portion of the third range;
training the first machine learning system to generate outputs for inputs within the first subset; and
training the second machine learning system to generate outputs for inputs within the second subset.

14. The method of claim 13, wherein the at least one profile parameter is selected based on one or more criteria including historical data, effective number of nodes, and sensitivity.

15. The method of claim 1, further comprising:
obtaining a measured diffraction signal using a metrology device;
comparing the measured diffraction signal with the simulated diffraction signal;
when the diffraction signals do not match within a matching criterion, generating another simulated diffraction signal to compare with the measured diffraction signal; and
when the diffraction signals do match within the matching criterion, determining a feature of the structure based on the one or more profile parameters used as the input to generate the matching simulated diffraction signal.

16. A machine learning system to generate an output for an input, wherein the input includes a plurality of profile parameters of a structure formed on a semiconductor wafer, wherein the output is a simulated diffraction signal, which characterizes light diffracted from the structure, the system comprising:
a processor;
a first machine learning system;
a second machine learning system; and
an interface connected to the first and second machine learning systems, wherein the interface is configured to:
a) receive the input from the processor;
b) determine if the input is within a first, second, or third range of values, wherein the ranges are separate and distinct ranges each containing at least one value;
c) if the input is within the first range, generate the output using the first machine learning system;
d) if the input is within the second range, generate the output using a second machine learning system; and
e) if the input is within the third range, generate the output using the first and second machine learning systems.

17. The system of claim 16, wherein the first machine learning system has been trained to generate outputs for inputs within the first range and at least a first portion of the third range, and wherein the second machine learning system has been trained to generate outputs for inputs within the second range and at least a second portion of the third range.

18. The system of claim 17, wherein the output in e) is generated by:
generating a first intermediate output for the input using the first machine learning system;
generating a second intermediate output for the input using the second machine learning system;
weighting the first and second intermediate outputs, wherein if the input is in the first portion of the third range, the first intermediate output is weighted more heavily than the second intermediate output, and wherein if the input is in the second portion of the third range, the second intermediate output is weighted more heavily than the first intermediate output; and
summing the weighted first and second intermediate outputs to generate the output.

19. The system of claim 16, wherein a set of possible values for the input is divided into a first, second, third, and fourth subset, wherein the first subset corresponds to the first range and at least a first portion of the third range, wherein the second subset corresponds to the second range and at least a second portion of the third range, wherein the first machine learning system has been trained to generate outputs for inputs within the first subset, wherein the second machine learning system has been trained to generate outputs for inputs within the second subset, further comprising:
a third machine learning system trained to generate outputs for inputs within the third subset; and
a fourth machine learning system trained to generate outputs for inputs within the fourth subset, wherein a boundary domain is defined with quadrants corresponding to portions of the first, second, third, and fourth subsets, and wherein, if the input is within the boundary domain, the output is generated by weighting intermediate outputs generated by the first, second, third, and fourth machine learning systems.

20. The system of claim 16, further comprising:

an optical metrology device configured to obtain a measured diffraction signal; and a processor configured to:
- compare the measured diffraction signal with the simulated diffraction signal;
- when the diffraction signals do not match within a matching criterion, generate another simulated diffraction signal to compare with the measured diffraction signal; and
- when the diffraction signals do match within the matching criterion, determine a feature of the structure based on the one or more profile parameters used as the input to generate the matching simulated diffraction signal.

21. A computer-readable storage medium containing computer executable instructions for using split machine learning systems to generate an output for an input, wherein the input includes a plurality of profile parameters of a structure formed on a semiconductor wafer, wherein the output is a simulated diffraction signal, which characterizes light diffracted from the structure, comprising instructions for:
   a) receiving the input;
   b) determining if the input is within a first, second, or third range of values, wherein the ranges are separate and distinct ranges each containing at least one value;
   c) if the input is within the first range, generating the output using a first machine learning system;
   d) if the input is within the second range, generating the output using a second machine learning system; and
   e) if the input is within the third range, generating the output using the first and second machine learning systems.

* * * * *